United States Patent
Iwai et al.

(10) Patent No.: US 8,293,449 B2
(45) Date of Patent: Oct. 23, 2012

(54) POSITIVE RESIST COMPOSITION AND METHOD OF FORMING RESIST PATTERN

(75) Inventors: Takeshi Iwai, Kawasaki (JP); Naotaka Kubota, Kawasaki (JP); Satoshi Fujimura, Kawasaki (JP); Hideo Hada, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 1748 days.

(21) Appl. No.: 10/466,473

(22) PCT Filed: Nov. 29, 2002

(86) PCT No.: PCT/JP02/12525
§ 371 (c)(1),
(2), (4) Date: Jul. 14, 2003

(87) PCT Pub. No.: WO03/048862
PCT Pub. Date: Jun. 12, 2003

(65) Prior Publication Data
US 2004/0058270 A1    Mar. 25, 2004

(30) Foreign Application Priority Data
Dec. 3, 2001  (JP) .................. 2001-369339

(51) Int. Cl.
G03F 7/00 (2006.01)
G03F 7/004 (2006.01)
G03F 7/40 (2006.01)

(52) U.S. Cl. .............. 430/270.1; 430/322; 430/905; 430/330; 430/913

(58) Field of Classification Search .............. 430/270.1, 430/322, 905, 910, 330
See application file for complete search history.

(56) References Cited

U.S. PATENT DOCUMENTS

| | | | |
|---|---|---|---|
| 5,968,713 A | 10/1999 | Nozaki et al. | |
| 6,004,720 A | 12/1999 | Takechi et al. | |
| 6,013,416 A | 1/2000 | Nozaki et al. | |
| 6,200,725 B1 | 3/2001 | Takechi et al. | |
| 6,280,898 B1 | 8/2001 | Hasegawa et al. | |
| 6,329,125 B2 | 12/2001 | Takechi et al. | |
| 6,344,304 B1 | 2/2002 | Takechi et al. | |
| 6,440,636 B1 | 8/2002 | Ushirogouchi et al. | 430/270.1 |
| 6,479,211 B1 | 11/2002 | Sato et al. | 430/270.1 |
| 6,579,659 B2 * | 6/2003 | Uetani et al. | 430/270.1 |
| 6,692,889 B1 | 2/2004 | Funaki et al. | 430/270.1 |
| 6,692,897 B2 * | 2/2004 | Fujimori et al. | 430/282.1 |
| 2001/0044070 A1 * | 11/2001 | Uetani et al. | 430/270.1 |

FOREIGN PATENT DOCUMENTS

| | | |
|---|---|---|
| EP | 0982628 | 3/2000 |
| EP | 1 172 384 | 1/2002 |
| JP | 02-146803 | 2/1992 |
| JP | 04-156818 | 12/1993 |
| JP | 09-130131 | 12/1998 |
| JP | 09-165935 | 1/1999 |
| JP | 2881969 | 2/1999 |
| JP | 11-037847 | 7/2000 |
| JP | 2000-338674 | 12/2000 |
| JP | 11-223144 | 2/2001 |
| JP | 2001-48933 A | 2/2001 |
| JP | 11-285762 | 4/2001 |
| JP | 2001-109154 A | 4/2001 |
| JP | 11-312329 | 5/2001 |
| JP | 2001-131232 A | 5/2001 |
| JP | A-2001-142212 | 5/2001 |
| JP | 2000-049549 | 9/2001 |
| JP | 2001-240625 A | 9/2001 |
| KR | 2001-051365 | 6/2001 |
| KR | 20010099670 | 11/2001 |
| WO | WO 01/10916 | 2/2001 |

OTHER PUBLICATIONS

PCT/ISA/220 Search Report of PCT/JP02/12525.
Korean Office Action, dated Jan. 26, 2006.
Japanese Office Action, dated Apr. 18, 2006.
Supplementary European Search Report for European Patent Application No. 02788696.9 corresponding to PCT/JP0212525 dated Oct. 6, 2008, and the transmission letter establishing receipt on Oct. 20, 2008.
Kim et al.; "A Comparative Study of Deep-UV Thin Resist by Electron Beam Stabilization," Journal of Photopolymer Science and Technology, vol. 13, No. 4, pp. 497-502 (2000).

* cited by examiner

Primary Examiner — Amanda C. Walke
(74) Attorney, Agent, or Firm — Knobbe Martens Olson & Bear LLP

(57) ABSTRACT

There is provided a positive type resist composition comprising (A) a resin component with only units derived from an acrylate ester in the principal chain, for which the solubility in alkali increases under the action of acid, (B) an acid generator component which generates acid on exposure, and (C) an organic solvent component, wherein the resin component (A) is a copolymer comprising (a1) a structural unit derived from an acrylate ester comprising, as an acid dissociable dissolution inhibiting group on a side chain, a polycyclic dissolution inhibiting group which is eliminated more easily than a 2-methyl-2-adamantyl group, (a2) a structural unit derived from an acrylate ester comprising a lactone containing polycyclic group on a side chain, and (a3) a structural unit derived from an acrylate ester comprising a hydroxyl group containing polycyclic group on a side chain; as well as a resist pattern formation method using such a composition.

10 Claims, No Drawings

US 8,293,449 B2

POSITIVE RESIST COMPOSITION AND METHOD OF FORMING RESIST PATTERN

TECHNICAL FIELD

The present invention relates to a positive type resist composition and a resist pattern formation method, and more specifically relates to a chemically amplified positive type resist composition suitable for use in a process using a wavelength of no more than 200 nm, and particularly an ArF excimer laser, as the light source, as well as a resist pattern formation method using such a composition.

BACKGROUND ART

Until recently, polyhydroxystyrenes or derivatives thereof in which the hydroxyl groups are protected with an acid dissociable, dissolution inhibiting group, which display high transparency relative to a KrF excimer laser (248 nm), have been used as the resin component of chemically amplified resists.

However, these days, the miniaturization of semiconductor elements has progressed even further, and the development of processes using ArF excimer lasers (193 nm) is being vigorously pursued.

For processes using an ArF excimer laser as the light source, resins comprising a benzene ring such as polyhydroxystyrene have insufficient transparency relative to the ArF excimer laser (193 nm).

In order to resolve this problem, resins containing no benzene rings, but instead comprising a unit derived from a (meth)acrylate ester incorporating an adamantane ring within the principal chain are attracting considerable interest, and many materials have already been proposed (Japanese Patent (Granted) Publication No. 2881969, Japanese Unexamined Patent Application, First Publication No. Hei 5-346668, Japanese Unexamined Patent Application, First Publication No. Hei 7-234511, Japanese Unexamined Patent Application, First Publication No. Hei 9-73173, Japanese Unexamined Patent Application, First Publication No. Hei 9-90637, Japanese Unexamined Patent Application, First Publication No. Hei 10-161313, Japanese Unexamined Patent Application, First Publication No. Hei 10-319595 and Japanese Unexamined Patent Application, First Publication No. Hei 11-12326). The term (meth)acrylate ester refers to acrylate esters or methacrylate esters.

In these publications, as can be seen in Japanese Unexamined Patent Application, First Publication No. 2001-131232 and Japanese Unexamined Patent Application, First Publication No. 2001-142212, but also true for the preceding technology described above, the materials comprising a unit derived from a (meth)acrylate ester within the principal chain are proposed without any discrimination between the acrylate ester and the methacrylate ester, although in the examples, materials with methacrylic acid as the principal chain are used, and practical applications also utilize materials with methacrylic acid in the principal chain.

The reason for this observation is that a resin with a conventional acrylate ester as the principal chain (hereafter, simply referred to as an acrylate ester resin), as disclosed in the above publications, displays a lower Tg value than a resin with a methacrylate ester as the principal chain (hereafter, simply referred to as a methacrylate ester resin). More specifically, this Tg value is considerably lower than conventional prebake temperatures of 120 to 140° C. and PEB (post exposure baking) temperatures of 120 to 130° C. required in chemically amplified resist compositions for vaporizing the solvent and forming the resist film, and enabling the acid generated from the acid generator to eliminate the acid dissociable, dissolution inhibiting groups, and in these processes, or even in processes with a lower temperature requirement of, for example, approximately 20° C. lower, formation of a resist pattern was impossible.

However, with the development of different etching films in recent years, a variety of etching gases can now be used, and as a result, a new problem has arisen in that surface roughness appears on the resist film following etching.

This surface roughness is different from conventional dry etching resistance, and in a film etched using a resist pattern as a mask, appears as distortions around the hole patterns in a contact hole pattern or as line edge roughness in a line and space pattern. Line edge roughness refers to non-uniform irregularities in the line side walls.

Furthermore, in addition to the surface roughness generated following etching, line edge roughness also occurs in the resist pattern following developing. This line edge roughness following developing also appears as distortions around the hole patterns in a contact hole pattern or as non-uniform irregularities in the line side walls in a line and space pattern.

In addition, the design rules required in modern semiconductor element production continue to become more stringent, and a resolution of no more than 150 nm, and in the vicinity of 100 nm is necessary, and further improvements in resolution are keenly sought. In resist patterns requiring this type of high resolution, distortions around the hole patterns or line edge roughness such as that described above becomes a larger problem than in conventional patterns.

In addition, resolving line slimming is also desirable. Line slimming is a phenomenon in which during observation of a resist pattern using a scanning electron microscope (SEM), the formed resist pattern shrinks and narrows. The cause of line slimming is reported to be due to the fact that when the formed resist pattern is exposed with the electron beam used in a SEM, a cross linking reaction occurs, causing slimming [Journal of Photopolymer Science Technology, Vol. 13, No. 4, page 497 (2000)].

As the design rules become tighter, this type of line slimming problem has an increasing effect on the production of semiconductor elements, and consequently improvements are keenly sought.

DISCLOSURE OF INVENTION

The present invention has an object of providing a chemically amplified positive type resist composition which displays excellent sensitivity and resolution, and enables the formation of a finely detailed resist pattern with low levels of surface roughness on etching, line edge roughness and line slimming.

The inventors of the present invention discovered that although a methacrylate ester resin is ideal for resist pattern formation in so far as the Tg value is high, the above type of surface roughness is prevalent in a resist formed using a methacrylate ester resin, and the methacrylate ester resin is the cause of the surface roughness.

In other words, the present invention provides a positive type resist composition comprising (A) a resin component with only units derived from an acrylate ester in the principal chain, for which the solubility in alkali increases under the action of acid, (B) an acid generator component which generates acid on exposure, and (C) an organic solvent component, wherein the resin component (A) is a copolymer comprising (a1) a structural unit derived from an acrylate ester comprising, as an acid dissociable dissolution inhibiting group, a polycyclic dissolution inhibiting group which is eliminated more easily than a 2-alkyl-2-adamantyl group, (a2) a structural unit derived from an acrylate ester comprising a lactone containing polycyclic group, and (a3) a structural unit derived from an acrylate ester comprising a hydroxyl group containing polycyclic group.

Furthermore, the present invention also provides a resist pattern formation method comprising the steps of providing a positive type resist composition described above on a substrate, conducting a prebake at 100 to 120° C. for 40 to 120 seconds, performing selective exposure, and then conducting PEB (post exposure baking) at 90 to 110° C. for 40 to 120 seconds, and performing alkali developing.

BEST MODE FOR CARRYING OUT THE INVENTION

In a positive type resist composition of the present invention, a resin component (A) must be a resin component which does not comprise, in the principal chain, any structural units derived from methacrylate esters which cause resist surface roughness, but comprises only structural units derived from acrylate esters, and for which the solubility in alkali increases under the action of acid. Furthermore, because a composition of the present invention is a positive type resist composition, the resin component (A) must have acid dissociable, dissolution inhibiting groups, and these groups must undergo elimination in the presence of acid generated by an acid generator, altering the resin from an alkali insoluble state to an alkali soluble state, or in other words, increasing the alkali solubility.

In addition, in a positive type resist composition of the present invention, this resin component (A) must be a copolymer comprising (a1) a structural unit derived from an acrylate ester comprising, as an acid dissociable dissolution inhibiting group, a polycyclic dissolution inhibiting group which is eliminated more easily than a 2-methyl-2-adamantyl group, (a2) a structural unit derived from an acrylate ester comprising a lactone containing polycyclic group, and (a3) a structural unit derived from an acrylate ester comprising a hydroxyl group containing polycyclic group.

In this manner, by introducing a polycyclic group into all of the essential structural units, the Tg value is increased, the problem of low Tg values associated with acrylate ester resins can be improved, and resist pattern formation can be achieved at temperatures slightly lower than conventional processes, namely, 100 to 120° C. for prebake, and 90 to 110° C. for PEB.

Examples of the polycyclic group incorporated within each structural unit include bicycloalkanes, tricycloalkanes and tetracycloalkanes groups, including groups in which one hydrogen atom is removed from a polycycloalkane such as adamantane, norbornane, isobornane, tricyclodecane and tetracyclododecane, and these can be selected appropriately from the multitude of groups proposed for use with ArF resists. Of the above groups, adamantyl groups and norbornyl groups are preferred, although the groups may be selected appropriately in accordance with the purpose of each of the structural units.

As follows is a description of each of the structural units of the resin component (A).

The structural unit (a1) is a structural unit derived from an acrylate ester comprising, as an acid dissociable dissolution inhibiting group, a polycyclic dissolution inhibiting group which is eliminated more easily than a 2-methyl-2-adamantyl group. It is evident that the introduction of a polycyclic group is successful in increasing the Tg value of the resin component (A), and in order to ensure that the resist pattern can be formed at as low a temperature as possible, the acid dissociability must be increased. As a result, the acid dissociable, dissolution inhibiting group of the structural unit (a1) must be eliminated more easily than a 2-methyl-2-adamantyl group, which is a representative acid dissociable group for an ArF positive type resist.

Provided the structural unit (a1) has these types of properties, there are no particular restrictions on the structural unit, although specific examples include at least one type of structural unit selected from the general formulas (I) and (II) shown below.

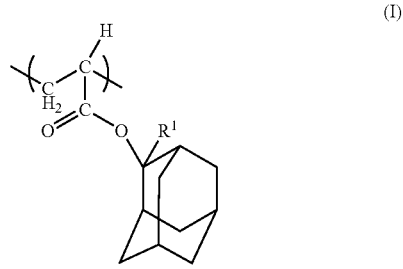

(I)

(wherein, $R^1$ represents a lower alkyl group of at least 2 carbon atoms)

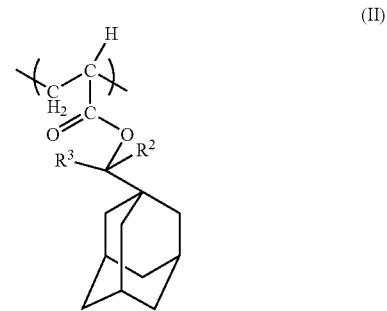

(II)

(wherein, $R^2$ and $R^3$ each represent, independently, a lower alkyl group)

Here, the aforementioned lower alkyl groups are preferably alkyl groups of no more than 5 carbon atoms.

In the structural unit represented by the general formula (I), by ensuring that $R^1$ is an alkyl group of at least 2 carbon atoms, the acid dissociability improves compared with the case in which $R^1$ is a methyl group. Suitable examples of $R^1$ include straight chain or branched chain alkyl groups such as ethyl groups, propyl groups, isopropyl groups, n-butyl groups, isobutyl groups, tert-butyl groups, pentyl groups, isopentyl groups and neopentyl groups, although from an industrial viewpoint, ethyl groups are preferred.

Furthermore, in the structural unit represented by the general formula (II), by ensuring that $R^2$ and $R^3$ each represent, independently, a lower alkyl group of 1 to 5 carbon atoms, the acid dissociability can be increased beyond that of a 2-methyl-2-adamantyl group. Examples of suitable groups for both $R^2$ and $R^3$ include methyl groups, or the same alkyl groups as the lower alkyl groups described above in relation to $R^1$, and of these, structural units in which both $R^2$ and $R^3$ are methyl groups are preferred industrially.

Next, the structural unit (a2) is a structural unit derived from an acrylate ester comprising a lactone containing polycyclic group. Lactone containing polycyclic groups are effective in increasing the adhesion between the resist layer and the substrate, and in improving the affinity with the developing liquid. There are no particular restrictions on the group, provided the lactone containing polycyclic group of the structural unit (a2) is a lactone containing polycyclic group, although specifically, lactone containing bicycloalkyl groups, and particularly the structural unit represented by the chemical formula shown below, provide a good balance between the Tg value raising effect for the resin component (A), and the lithography characteristics of the resist, and are consequently preferred.

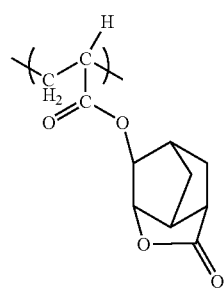

The structural unit (a3) is a structural unit derived from an acrylate ester comprising a hydroxyl group containing polycyclic group. This structural unit contains a polar group such as a hydroxyl group, and consequently improves the overall affinity of the resin component (A) with the developing liquid, and improves the alkali solubility of the exposed sections. Accordingly, this structural unit contributes to improved resolution.

There are no particular restrictions on the group, provided the hydroxyl group containing polycyclic group of the structural unit (a3) is a hydroxyl group containing polycyclic group, although specifically, hydroxyl group containing adamantyl groups, and particularly the structural unit represented by the chemical formula shown below, provide a good balance between the Tg value raising effect for the resin component (A), and the lithography characteristics of the resist, and are consequently preferred.

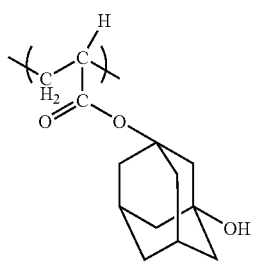

In the resin component (A) of a positive type resist composition of the present invention, if the combined total of the structural unit (a1), the structural unit (a2), and the structural unit (a3) is deemed 100 mol %, then resins in which the structural unit (a1) accounts for 30 to 60 mol %, and preferably 35 to 45 mol %, the structural unit (a2) accounts for 20 to 60 mol %, and preferably 25 to 35 mol %, and the structural unit (a3) accounts for 10 to 50 mol %, and preferably 20 to 30 mol %, are preferred in terms of improving the balance between the reduction in surface roughness during etching, line edge roughness and line slimming, and the resolution.

The resin component (A) may also contain other structural units, provided such inclusion does not impair the effects of the present invention, although resins formed from the structural unit (a1), the structural unit (a2) and the structural unit (a3) are preferred.

Furthermore, there are no particular restrictions on the weight average molecular weight of the resin component (A), although values from 5,000 to 30,000 are preferred, and values from 8,000 to 20,000 are even more desirable. If the weight average molecular weight is larger than this range, then the solubility relative to the resist solvent deteriorates, whereas if smaller than the above range, the shape of the resist pattern can deteriorate, which is also undesirable.

The resin component (A) can be produced easily by known radical polymerization of the corresponding acrylate ester monomer using a radical polymerization initiator such as azobisisobutyronitrile (AIBN).

On the other hand, an acid generator component (B) of a positive type resist composition of the present invention, which generates acid on exposure, can be appropriately selected from known materials used as acid generators in conventional chemically amplified resists. Examples of the acid generator include onium salts such as diphenyliodonium trifluoromethanephosphate, (4-methoxyphenyl)phenyliodonium trifluoromethanesulfonate, bis(p-tert-butylphenyl)iodonium trifluoromethanesulfonate, triphenylsulfonium trifluoromethanesulfonate, (4-methoxyphenyl)diphenylsulfonium trifluoromethanesulfonate, (p-tert-butylphenyl)diphenylsulfonium trifluoromethanesulfonate, diphenyliodonium nonafluorobutanesulfonate, bis(p-tert-butylphenyl)iodonium nonafluorobutanesulfonate and triphenylsulfonium nonafluorobutanesulfonate. Of these, onium salts with a fluorinated alkylsulfonate ion as the anion are preferred.

This radical acid generator component (B) may utilize a single compound, or a combination of two or more compounds. The quantity of the acid generator component (B) is typically selected within a range from 0.5 to 30 parts by mass, and preferably 1 to 10 parts by mass per 100 parts by mass of the resin component (A). If the quantity is less than 0.5 parts by mass then the pattern formation does not proceed adequately, whereas if the quantity exceeds 30 parts by mass, then achieving a uniform solution becomes difficult, causing a deterioration in storage stability.

A positive type resist composition of the present invention is used as a solution obtained by dissolving the aforementioned resin component (A) and the acid generator component (B) in an organic solvent (C). Provided the solvent is capable of dissolving both components to generate a uniform solution, then the solvent used can be one, or two or more solvents selected from amongst known solvents used for conventional chemically amplified resists.

Examples of this type of organic solvent (C) include ketones such as acetone, methyl ethyl ketone, cyclohexanone, methyl isoamyl ketone and 2-heptanone; polyhydric alcohols and derivatives thereof such as ethylene glycol, ethylene glycol monoacetate, diethylene glycol, diethylene glycol monoacetate, propylene glycol, propylene glycol monoacetate, dipropylene glycol, or the monomethyl ether, monoethyl ether, monopropyl ether, monobutyl ether or monophenyl ether of dipropylene glycol monoacetate; cyclic ethers such as dioxane; and esters such as methyl lactate, ethyl lactate, methyl acetate, ethyl acetate, butyl acetate, methyl pyruvate, ethyl pyruvate, methyl methoxypropionate, and ethyl ethoxypropionate. These organic solvents may be used singularly, or as mixed solvents of two or more different solvents. In terms of mixed solvents, mixed solvents of propylene glycol monomethyl ether acetate and a lactate ester are preferred. The mixture ratio is preferably a mass referenced ratio from 8:2 to 2:8.

In a positive type resist composition of the present invention, using a mixed solvent containing at least one of propylene glycol monomethyl ether acetate and ethyl lactate, together with γ-butyrolactone as the organic solvent is advantageous. In such a case, the mass ratio of the former and latter components in the mixed solvent is selected within a range from 70:30 to 95:5.

In a positive type resist composition of the present invention, in order to improve the resist pattern shape and the long term stability (the post exposure stability of the latent image formed by the pattern-wise exposure of the resist layer), a secondary lower aliphatic amine or a tertiary lower aliphatic amine can also be added as a component (D). Here, a lower aliphatic amine refers to an alkyl amine or an alkyl alcohol amine of no more than 5 carbon atoms, and examples of these secondary and tertiary amines include trimethylamine, diethylamine, triethylamine, di-n-propylamine, tri-n-propylamine, tripentylamine, diethanolamine and triethanolamine, and trialkanolamines are particularly preferred.

These may be used singularly, or in combinations of two or more compounds.

These amines are typically added in quantities within a range from 0.01 to 0.2 mass % relative to the quantity of the resin component (A).

Miscible additives can also be added to a positive type resist composition of the present invention according to need, including additive resins for improving the properties of the resist film, surfactants for improving the ease of application, dissolution inhibitors, plasticizers, stabilizers, colorants and halation prevention agents.

In a pattern formation method of the present invention, because the resin component (A) in the positive type resist composition of the present invention utilizes an easily eliminated, acid dissociable, dissolution inhibiting group in the structural unit (a1), pattern formation can be conducted at a lower temperature than that used in conventional resist pattern formation processes. In other words, the resist composition is first applied to the surface of a substrate such as a silicon wafer using a spinner, a prebake is conducted at 100 to 120° C. for 40 to 120 seconds, and preferably for 60 to 90 seconds, and then following selective exposure of an ArF excimer laser through a desired mask pattern using, for example, an ArF exposure apparatus, PEB (post exposure baking) is conducted at 90 to 110° C. for 40 to 120 seconds, and preferably for 60 to 90 seconds. Subsequently, developing is conducted using an alkali developing liquid such as a 0.1 to 10 mass % aqueous solution of tetramethylammonium hydroxide. In this manner, a resist pattern which is faithful to the mask pattern can be obtained.

Furthermore, although a composition of the present invention is particularly applicable to ArF excimer lasers, it is also effective for other types of radiation of shorter wavelength such as $F_2$ lasers, EUV (extreme ultraviolet radiation), VUV (vacuum ultraviolet radiation), electron beams, X-rays and soft X-rays.

EXAMPLES

As follows is a more detailed description of the present invention using a series of examples.

In each of the examples, the surface roughness following etching and the line slimming were measured using the methods described below.

(1) Surface Roughness Following Etching:

Using a mixed gas of tetrafluoromethane ($CF_4$), trifluoromethane ($CHF_3$) and helium (flow rate ratio 30:30:100) as the etching gas, a resist film formed by applying a resist composition to a substrate at a pressure of 0.3 Torr and a temperature of 20° C., prebaking, exposing the composition without using a mask pattern and then performing PEB (hereafter, this resist film is described as an unpatterned resist film) was treated for 2 minutes using an etching apparatus (TCE-7612X, a trade name, manufactured by Tokyo Ohka Kogyo Co., Ltd.) using a RF (radio frequency) of 400 kHz with an output of 600 W, and the surface following this dry etching was numericalized with an AFM (atomic force microscope), and the Rms value (root mean square surface roughness), which is a value representing the surface roughness, was then evaluated.

The reason for performing the evaluation using an unpatterned resist film is that surface roughness can be more easily measured than in the case of a patterned resist film.

(2) Line Slimming:

An isolated pattern was formed, and then using a measuring SEM (S-8820, a trade name, manufactured by Hitachi, Ltd.), the width of the resist pattern prior to, and following irradiation were measured and compared. (time affected by electron beam: approximately 30 seconds)

Example 1

Resin Component (A): 100 parts by mass of a copolymer formed from structural units represented by the structural formulas shown below (proportion x of structural unit (a1)= 40 mol %, proportion y of structural unit (a2)=30 mol %, proportion z of structural unit (a3)=30 mol %, weight average molecular weight: 14,000),

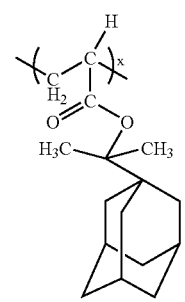

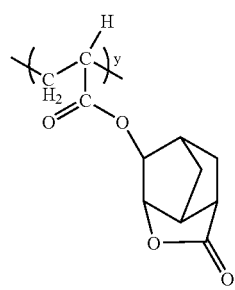

-continued

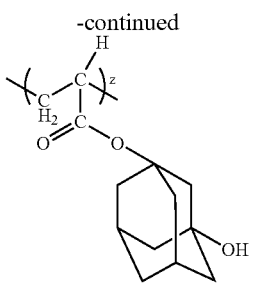

Acid Generator Component (B): 3 parts by mass of triphenylsulfonium nonafluorobutanesulfonate, and component (D): 0.1 parts by mass of triethanolamine were dissolved in an organic solvent component (C) comprising a mixed solvent of 450 parts by mass of propylene glycol monomethyl ether acetate and 300 parts by mass of ethyl lactate, yielding a uniform positive type resist composition solution.

This solution was applied to the surface of a silicon wafer using a spinner and then prebaked for 90 seconds at 110° C. on a hotplate, and formed a resist layer with a film thickness of 400 nm. This film was selectively irradiated with an ArF excimer laser (193 nm), using an ArF exposure apparatus (Micro Step, a trade name, manufactured by ISI Corporation, NA=0.60, σ=0.75), subjected to PEB treatment at 100° C. for 90 seconds, and was then subjected to puddle development for 60 seconds in a 2.38 mass % aqueous solution of tetramethylammonium hydroxide, washed for 30 seconds with water, and dried.

The hole resist pattern formed by the above operation provided smooth circular shapes with a hole diameter of 130 nm and no distortion around the periphery of the holes, and displayed no line edge roughness.

Furthermore, when the exposure time (sensitivity) was measured in units of $mJ/cm^2$ (quantity of energy), the result was 21 $mJ/cm^2$.

The depth of focus range of this 130 nm hole resist pattern was 300 nm.

The surface roughness of this resist film following etching was Rms 1.1 nm, and in terms of line slimming, there was almost no variation, with the original width of the resist pattern of 100 nm becoming 96 nm following electron beam irradiation.

Example 2

With the exception of using a copolymer in which the proportions of x, y and z were 30 mol %, 50 mol % and 20 mol % respectively, a positive type resist composition solution was prepared in the same manner as the example 1.

Using this solution, a line and space pattern was formed under the same lithography conditions as the example 1.

As a result, a 130 nm line and space pattern was formed with a good rectangular cross section and with good resolution. The sensitivity was 11 $mJ/cm^2$. Furthermore, the line edge roughness of this pattern was determined by measuring the resist pattern width of the sample at 32 positions using a measuring SEM (S-9220, a trade name, manufactured by Hitachi, Ltd.), and from these measurement results, the value of 3 times the standard deviation (3σ) was calculated. The smaller this 3σ value is, the lower the level of roughness, indicating a resist pattern with a uniform width. The value of 3σ was 4.2 nm.

The Rms value, which is a measure of the surface roughness of the resist pattern, was 1.6 nm, and in terms of line slimming there was almost no variation, with the value of 100 nm prior to electron beam irradiation becoming 96 nm following irradiation.

Comparative Example 1

With the exception of using a resin component (A) in which the acrylate of the structural unit (a1) of the resin component (A) from the example 1 was replaced with a methacrylate comprising a dissolution inhibiting group of the same structure, preparation was performed in the same manner as the example 1, or in other words, with the exception of setting the proportion x of a structural unit of the structural formula shown below to 40 mol %, a positive type resist composition solution was prepared in the same manner as the example 1.

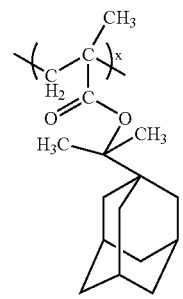

Subsequently, using this solution, but with the exception of altering the lithography conditions to a prebake at 130° C. for 90 seconds and PEB at 120° C. for 90 seconds, a resist pattern was formed in a similar manner to the example 1.

The hole resist pattern formed in this manner provided circular shapes with a hole diameter of 130 nm and distortions around the periphery of the holes, displaying line edge roughness. Furthermore, the sensitivity was 16 $mJ/cm^2$. The depth of focus range of this 130 nm hole resist pattern was 300 nm.

A 130 nm line and space pattern was also formed in a separate preparation, and when the 3σ value was determined in the same manner as the example 2 as a measure of the line edge roughness, the value was 8.8 nm.

Furthermore in terms of line slimming, the value of 100 nm prior to electron beam irradiation fell to 92 nm following irradiation.

Comparative Example 2

With the exception of using a resin component (A) in which the structural unit (a1) of the resin component (A) from the example 1 was replaced with a 2-methyl-2-adamantyl acrylate, preparation was performed in the same manner as the example 1, or in other words, with the exception of setting the proportion x of a structural unit of the structural formula shown below to 40 mol %, a positive type resist composition solution was prepared in the same manner as the example 1.

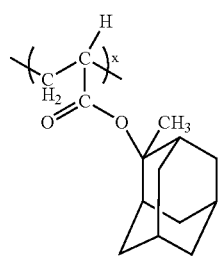

Subsequently, using this solution, a hole resist pattern was formed under the same lithography conditions as the example 1, and a 130 nm line and space pattern was formed in the same manner as the example 2.

Although the hole resist pattern formed in this manner had a hole diameter of 130 nm, the sensitivity exceeded 100 mJ/cm², and furthermore, the cross-sectional shape of the 130 nm line and space pattern was a taper shape, and the sensitivity was an unsatisfactory 60 mJ/cm².

Furthermore using a separate solution, and with the exception of altering the lithography conditions to a prebake at 130° C. for 90 seconds and PEB at 120° C. for 90 seconds, a hole resist pattern was formed in a similar manner to the example 1, and a 130 nm line and space pattern was formed in a similar manner to the example 2.

Although the thus formed hole resist pattern had a hole diameter of 130 nm, the side walls thereof displayed a marked taper, and the depth of focus range of this 130 nm hole resist pattern was 0 nm.

Furthermore, the 130 nm line and space pattern had a triangular cross-section and was unsatisfactory.

In addition, the Rms value, which is a measure of the surface roughness of the resist pattern, was 1.3 nm.

Comparative Example 3

With the exception of using a copolymer in which the proportion x of the same structural unit (a1) as the example 1 was 50 mol % and the proportion y of the same structural unit (a2) as the example 1 was 50 mol %, and in which there was no structural unit (a3), instead of the resin component (A) of the example 1, a positive type resist solution was prepared in the same manner as the example 1, and subsequently, using this solution, a hole resist pattern was formed in a similar manner to the example 1, and a 130 nm line and space pattern was formed in a similar manner to the example 2.

Although the thus formed hole resist pattern formed in this manner had a hole diameter of 130 nm, the depth of focus range of the 130 nm hole resist pattern was 100 nm.

Furthermore, the 130 nm line and space pattern developed an inclination, and was unsatisfactory.

In addition, the Rms value, which is a measure of the surface roughness of the resist pattern, was 0.9 nm.

As is evident from the above results, a hole resist pattern of a resist film using a positive type resist composition of the present invention provides a smooth circular shape with no distortions around the periphery of the holes and no line edge roughness, and a line and space pattern also displays a good rectangular cross section with good resolution, with little roughness and a small Rms value which indicates surface roughness. In addition, the sensitivity during formation of these patterns is also good. Line slimming is also almost non-existent.

In contrast, with a resist composition which instead of the acrylate of the structural unit (a1) used a methacrylate comprising a dissolution inhibiting group of the same structure, a hole resist pattern displayed distortions around the periphery of the holes, and also displayed line edge roughness. Furthermore, it was also evident that the roughness of a line and space pattern was large, and line slimming occurred.

Furthermore, in the case in which 2-methyl-2-adamantyl acrylate was used as the structural unit (a1), the sensitivity was inadequate, the cross-sectional shape of a line and space pattern was either tapered or a triangular shape, and the Rms value was larger than for a material of the present invention.

In the case in which a copolymer with no structural unit (a3) was used, the line and space pattern developed an inclination, and was unsatisfactory.

INDUSTRIAL APPLICABILITY

A composition of the present invention is a chemically amplified type composition, and displays good transparency, a high level of sensitivity and a high resolution relative to activated light of less than 200 nm, and particularly ArF excimer laser light, and also produces a resist film following etching with little surface roughness, and little line edge roughness in a line and space pattern. Furthermore, a detailed resist pattern with little line slimming when viewed with a scanning electron microscope can also be provided. Accordingly, as a chemically amplified positive type resist using an ArF excimer laser as the light source, a composition of the present invention can be ideally used in the production of semiconductor elements and the like which require ultra fine processing. Consequently, a composition of the present invention is extremely useful for industrial applications.

The invention claimed is:
1. A positive type resist composition comprising:
(A) a resin component with only units derived from an acrylate ester in a principal chain, for which solubility in alkali increases under action of acid;
(B) an acid generator component which generates acid on exposure; and
(C) an organic solvent component, wherein said resin component (A) is a copolymer including
(a1) a structural unit derived from an acrylate ester comprising, as an acid dissociable dissolution inhibiting group, a polycyclic dissolution inhibiting group which is eliminated more easily than a 2-methyl-2-adamantyl group;
(a2) a structural unit derived from an acrylate ester comprising a lactone containing norbornyl group; and
(a3) a structural unit derived from an acrylate ester comprising a hydroxyl group containing polycyclic group, wherein said structural unit (a1) is represented by a chemical formula (I) shown below:

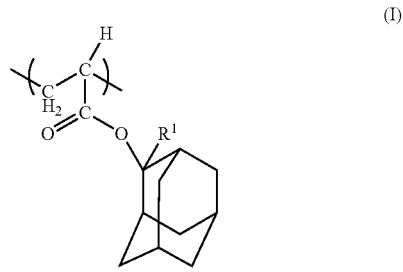

wherein, $R^1$ represents an ethyl group, said structural unit (a2) is a unit derived from an acrylate ester comprising a lactone containing bicycloalkyl group, and said structural unit (a3) is represented by a chemical formula shown below

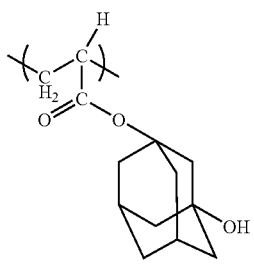

and, wherein if a combined total of said structural unit (a1), said structural unit (a2) and said structural unit (a3) is deemed 100 mol %, then said structural unit (a1) is within a range from 30 to 60 mol %, said structural unit (a2) is within a range from 20 to 60 mol %, and said structural unit (a3) is within a range from 10 to 50 mol %.

2. A positive type resist composition according to claim 1, wherein said structural unit (a2) is represented by a chemical formula shown below

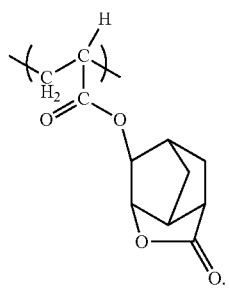

3. A positive type resist composition according to claim 1, wherein said acid generator component (B) is an onium salt with a fluorinated alkylsulfonate ion as an anion.

4. A positive type resist composition according to claim 1, wherein in addition to said resin component (A), said acid generator component (B) and said organic solvent (C), a secondary or tertiary lower aliphatic amine (D) is also provided in a quantity of 0.01 to 0.2 mass % relative to a quantity of said resin component (A).

5. A resist pattern formation method comprising the steps of providing a positive type resist composition according to any one of claim 2, 3, or 4 on a substrate, conducting a prebake at 100 to 120° C., performing selective exposure, and then conducting PEB (post exposure baking) at 90 to 110° C., and performing alkali developing.

6. A positive type resist composition comprising:
(A) a resin component with only units derived from an acrylate ester in a principal chain, for which solubility in alkali increases under action of acid;
(B) an acid generator component which generates acid on exposure; and
(C) an organic solvent component, wherein said resin component (A) is a copolymer including
(a1) a structural unit derived from an acrylate ester comprising, as an acid dissociable dissolution inhibiting group, a polycyclic dissolution inhibiting group which is eliminated more easily than a 2-methyl-2-adamantyl group, (a2) a structural unit derived from an acrylate ester comprising a lactone containing polycyclic group, and
(a3) a structural unit derived from an acrylate ester comprising a hydroxyl group containing polycyclic group,
wherein said structural unit (a1) is at least one unit selected from a group consisting of members represented by a general formula (II) shown below:

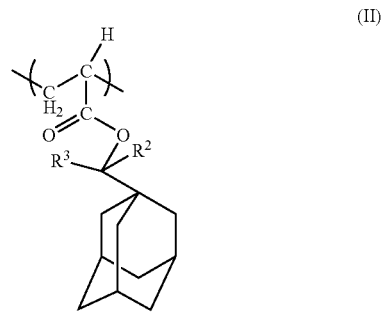

wherein, $R^2$ and $R^3$ are both methyl groups,
said structural unit (a2) is a unit derived from an acrylate ester comprising a lactone containing norbornyl group, and
said structural unit (a3) is represented by a chemical formula shown below

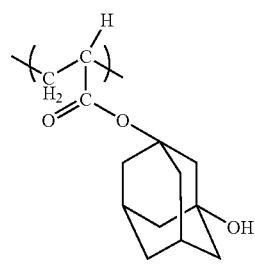

and, wherein if a combined total of said structural unit (a1), said structural unit (a2) and said structural unit (a3) is deemed 100 mol %, then said structural unit (a1) is within a range from 30 to 60 mol %, said structural unit (a2) is within a range from 20 to 60 mol %, and said structural unit (a3) is within a range from 10 to 50 mol %.

7. A positive type resist composition according to claim 6, wherein said structural unit (a2) is represented by a chemical formula shown below

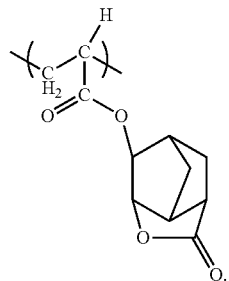

8. A positive type resist composition according to claim 6, wherein said acid generator component (B) is an onium salt with a fluorinated alkylsulfonate ion as an anion.

9. A positive type resist composition according to claim 6, wherein in addition to said resin component (A), said acid generator component (B) and said organic solvent (C), a secondary or tertiary lower aliphatic amine (D) is also provided in a quantity of 0.01 to 0.2 mass % relative to a quantity of said resin component (A).

10. A resist pattern formation method comprising the steps of providing a positive type resist composition according to any one of claim 6, 7, 8 or 9 on a substrate, conducting a prebake at 100 to 120° C., performing selective exposure, and then conducting PEB (post exposure baking) at 90 to 110° C., and performing alkali developing.

* * * * *

UNITED STATES PATENT AND TRADEMARK OFFICE
CERTIFICATE OF CORRECTION

PATENT NO. : 8,293,449 B2
APPLICATION NO. : 10/466473
DATED : October 23, 2012
INVENTOR(S) : Takeshi Iwai et al.

It is certified that error appears in the above-identified patent and that said Letters Patent is hereby corrected as shown below:

On the Title Page:

In (Item 56), Column 2, Line 10, Below "JP 11-037847 7/2000"

insert --JP 2000-330287 11/2000--.

In the Claims:

In Column 13, Line 52, In Claim 5, change "claim 2, 3, or 4"

to --claim 1, 2, 3 or 4--.

Signed and Sealed this
Twenty-third Day of April, 2013

Teresa Stanek Rea
*Acting Director of the United States Patent and Trademark Office*